US009196585B2

(12) United States Patent
Katakura

(10) Patent No.: US 9,196,585 B2
(45) Date of Patent: Nov. 24, 2015

(54) POLYSILICON FUSE, SEMICONDUCTOR DEVICE HAVING OVERLAPPING POLYSILICON FUSE SECTIONS AND METHOD OF SEVERING POLYSILICON FUSE

(71) Applicant: FUJI ELECTRIC CO., LTD., Kawasaki-shi (JP)

(72) Inventor: Hideaki Katakura, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 14/536,915

(22) Filed: Nov. 10, 2014

(65) Prior Publication Data

US 2015/0155237 A1 Jun. 4, 2015

(30) Foreign Application Priority Data

Dec. 3, 2013 (JP) ................................ 2013-250230

(51) Int. Cl.
*H01L 23/525* (2006.01)
*H01L 21/326* (2006.01)

(52) U.S. Cl.
CPC .......... *H01L 23/5256* (2013.01); *H01L 21/326* (2013.01); *H01L 2924/0002* (2013.01)

(58) Field of Classification Search
CPC .......................... H01L 23/5256; H01L 21/326
USPC .......... 257/529, 455, E23.149; 438/215, 132, 438/281, 467, 601
See application file for complete search history.

(56) References Cited

U.S. PATENT DOCUMENTS 5,444,287 A * 8/1995 Bezama et al. ............... 257/467
5,614,440 A * 3/1997 Bezama .............. H01L 23/5256 148/DIG. 55
6,469,363 B1 * 10/2002 Delpech et al. ............... 257/529
6,586,985 B1 * 7/2003 Romas, Jr. .......... H01L 27/0802 257/E23.149
2005/0077594 A1 4/2005 Matsunaga et al.
2011/0248379 A1 * 10/2011 Yonezu et al. ................ 257/529
2013/0037908 A1 * 2/2013 Hopper et al. ................ 257/529

FOREIGN PATENT DOCUMENTS

JP 2003258104 A 9/2003
JP 2006073947 A 3/2006
JP 4164054 B2 10/2008
JP 2010251499 A 11/2010

* cited by examiner

*Primary Examiner* — Peter Bradford
(74) *Attorney, Agent, or Firm* — Rossi, Kimms & McDowell LLP

(57) ABSTRACT

In some aspects of the invention, a first polysilicon fuse section for forming a cavity is provided in close proximity to a second polysilicon fuse section for adjusting circuit characteristics. By forming a cavity with the first polysilicon fuse section made to be blown, fused polysilicon is contained in the cavity when the second polysilicon fuse section is blown to make it possible to provide a polysilicon fuse capable of stably maintaining an electrical insulated state. This can provide a polysilicon fuse capable of stably maintaining the electrical insulated state when the fuse is blown, a semiconductor device having the polysilicon fuse and a method of severing the polysilicon fuse.

9 Claims, 16 Drawing Sheets

POLYSILICON FUSE, SEMICONDUCTOR DEVICE HAVING OVERLAPPING POLYSILICON FUSE SECTIONS AND METHOD OF SEVERING POLYSILICON FUSE

CROSS-REFERENCE TO RELATED APPLICATION

This application is based on, and claims priority to, Japanese Patent Application No. 2013-250230, filed on Dec. 3, 2013. The disclosure of the priority application, in its entirety, including the drawings, claims, and the specification thereof, is incorporated herein by reference.

BACKGROUND OF INVENTION

1. Field of the Invention

Embodiments of the invention relate to polysilicon fuses and semiconductor devices having polysilicon fuses.

2. Related Art

A polysilicon fuse is used as a trimming device for carrying out trimming that finely adjusts the value of an element such as the resistance value of a resistor in a semiconductor circuit such as a semiconductor integrated circuit formed in a semiconductor substrate. For example, a plurality of resistors connected in parallel with one another are provided in a semiconductor integrated circuit, to each of which resistors a polysilicon fuse as a trimming device is connected. Adjustment of the resistance value is carried out by blowing the polysilicon fuses with the use of a laser irradiation method or a voltage application method. In particular, the voltage application method is a simple and easy method that can be carried out together with a wafer characteristics test carried out after the fabrication process of the semiconductor integrated circuit has been completed.

FIG. 16A is a plan view showing the structure of the principal part of a related polysilicon fuse 600. FIG. 16B is a cross sectional view cut along line X-X of FIG. 16A.

The principal part of a related polysilicon fuse 600 is provided with a narrowed portion 51 of narrow width polysilicon, two electrode portions 52 of wide width polysilicon and two metal electrodes 54 each connected to the electrode portion 52 through a via hole 53. The narrowed portion 51 and electrode portions 52 are formed on an insulating film 55 formed by the LOCOS (Local Oxidation of Silicon) process etc. Between the electrode portion 52 and the metal electrode 54, an interlayer dielectric 56 (HTO (High Temperature Oxide) film etc.) having via holes 53 is arranged with a surface protecting film 57 provided to cover the metal electrodes 54. For the polysilicon forming the polysilicon fuse 600, doped polysilicon or ion-implanted polysilicon is used, the specific resistance of which is adjusted by adjusting an amount of doping or an amount of implanted ions. In the following, blowing of a polysilicon fuse by the voltage application method will be explained.

Application of a voltage to the metal electrodes 54 of the polysilicon fuse 600 causes a current to flow in the narrowed portion 51, which is heated to fuse. At this time, the polysilicon of the electrode portions 52 close to the narrowed portion 51 also fuses. The polysilicon fused at the narrowed portion 51 and at each of the electrode portions 52 is attracted to the side of each of the electrode portions 52 by the surface tension of the fused polysilicon to be severed. At this time, at the narrowed portion 51, the fused polysilicon is finely severed. With the fused polysilicon severed (blown) at the narrowed portion 51, the polysilicon fuse 600 is brought into an electrically insulated state. The severed polysilicon fuse 600 reduces the number of resistors formed in parallel in the semiconductor circuit for adjusting the circuit characteristics, by which the resistance value in the semiconductor circuit is adjusted.

Next, related methods disclosed in patent documents will be explained, each of which methods is for stably blowing an electric fuse by using the voltage application method.

In Japanese Patent Application Publication No. JP-A-2003-258104, a method is disclosed, in which an opening is provided on the side of the fuse blowing section of a polycrystalline silicon fuse and an insulating film on the side wall side of the fuse is made to rupture toward the opening without affecting an insulating film on the fuse.

In Japanese Patent Application Publication No. JP-A-2010-251499, a method is disclosed in which a gap is provided on the side surface of the fuse blowing section of an electric fuse. In Japanese Patent No. 4,164,054, a method is disclosed in which the stress in an interlayer dielectric covering a polysilicon fuse is relaxed for preventing faulty breaking of the polysilicon fuse.

In Japanese Patent Application Publication No. JP-A-2006-73947, it is disclosed that an electric fuse structure has an upper layer electric fuse and a lower layer electric fuse arranged vertically. By applying a bias voltage to each of the upper layer electric fuse and lower layer electric fuse, the fuses can be blown. Furthermore, one end of the upper layer electric fuse and one end of the lower layer electric fuse are commonly connected to enable the potential at the one end of the upper layer electric fuse and the potential at the one end of the lower layer electric fuse to be common to them easily. The electric fuse is used for switching memory arrays.

A semiconductor device having the polysilicon fuse described in the foregoing is required to have a high reliability. In such a semiconductor device, however, when the device is operated at a high temperature, residues of polysilicon finely divided at blowing are connected to one another by a migration phenomenon to cause a leak current to flow to make the polysilicon fuse impossible to stably maintain an electrically insulated state. This causes the resistance value of a resistor in a semiconductor circuit to deviate from an optimum value to affect the circuit characteristics of the semiconductor device.

FIG. 17 is an enlarged cross sectional view showing the narrowed portion 51 after blowing of the polysilicon fuse 600. When residues 58 in the space left after the blowing of the polysilicon of the narrowed portion 51 are joined to the polysilicon of the electrode portions 52 by a migration phenomenon as is shown by dotted lines, a leak current flows. The action of the migration phenomenon is accelerated at a high temperature (at operation) to change circuit characteristics of the semiconductor device in operation to lower the reliability of the semiconductor device.

SUMMARY OF THE INVENTION

Some embodiments of the invention are directed to addressing the above-described and other problems in the art and to providing a polysilicon fuse capable of stably maintaining an electrically insulated state when blown, a semiconductor device having the polysilicon fuse and a method of severing the polysilicon fuse.

In some embodiments, a polysilicon fuse according to the invention is provided as a polysilicon fuse including: a first polysilicon fuse section for forming a cavity, the first polysilicon fuse section having a first narrowed portion with a narrow width and, on each side of the first narrowed portion, having a first electrode portion with a wide width which is connected to the first narrowed portion; and a second polysilicon fuse section for adjusting circuit characteristics, the second polysilicon fuse section having a second narrowed portion with a narrow width and, on each side of the second narrowed portion, having a second electrode portion with a wide width which is connected to the second narrowed portion, in which the first narrowed portion and the second narrowed portion are arranged opposite to each other with an insulating film put in between.

In some embodiments, the first polysilicon fuse section and the second polysilicon fuse section are arranged so that they are orthogonal to each other with the first narrowed portion and second narrowed portion overlaid with each other. This makes fused polysilicon in the second polysilicon fuse section fall into a cavity formed with the first polysilicon fuse section blown to reliably sever the second polysilicon fuse section. This preferably allows the polysilicon fuse to maintain an electrically stable insulated state.

In some embodiments. the insulating film has a thickness between 0.1 μm and 0.5 μm. The insulating film with a thickness made to be less than 0.1 μm is sometimes broken by the blowing of the first polysilicon fuse section. While, the thickness in excess of 0.5 μm makes no insulating film broken when the second polysilicon fuse section is blown to make it impossible for the fused polysilicon to be contained in the cavity.

In some embodiments, a semiconductor device having the at least one polysilicon fuse is made to be provided as a semiconductor device including: a first trimming pad connected to the at least one polysilicon fuse at the first electrode portion on the one side of the first polysilicon fuse section; a second trimming pad connected to the at least one polysilicon fuse at the second electrode portion on the one side of the second polysilicon fuse section; a first circuit characteristic adjusting element connected to the at least one polysilicon fuse with one end at the second electrode portion on the one side of the second polysilicon fuse section; and a second circuit characteristic adjusting element connected to the ground with one end, in which the first electrode portion on the other side of the first polysilicon fuse section and the second electrode portion on the other side of the second polysilicon fuse section are connected to the ground, and the first circuit characteristic adjusting element and the second circuit characteristic adjusting element are connected in parallel to each other with their respective other ends.

In some embodiments, an example of each of the first circuit characteristic adjusting element and the second circuit characteristic adjusting element is a resistor. Of course, other electronic parts (MOSFET etc.) can be used.

Moreover, in some embodiments, the semiconductor device can be provided as a semiconductor device including: a diode arranged with the anode thereof connected to the at least one polysilicon fuse at the first electrode portion on the one side of the first polysilicon fuse section and the cathode thereof connected to the at least one polysilicon fuse at the second electrode portion on the one side of the second polysilicon fuse section: a trimming pad connected to the at least one polysilicon fuse at the first electrode portion on the one side of the first polysilicon fuse section to which portion the anode of the diode is connected; a first circuit characteristic adjusting element connected to the at least one polysilicon fuse with one end at the second electrode portion on the one side of the second polysilicon fuse section to which portion the cathode of the diode is connected; and a second circuit characteristic adjusting element connected to the ground with one end, in which the first electrode portion on the other side of the first polysilicon fuse section and the second electrode portion on the other side of the second polysilicon fuse section are connected to the ground, and the first circuit characteristic adjusting element and the second circuit characteristic adjusting element are connected in parallel to each other with their respective other ends. In such a transistor device, the second trimming pad is omitted to allow the number of trimming pads to be preferably reduced. Also in the transistor device, each of the first circuit characteristic adjusting element and the second circuit characteristic adjusting element is preferably a resistor. Of course, other electronic parts (MOSFET etc.) can be used.

In some embodiments, a method of severing the polysilicon fuse is provided as a method including the steps of: forming a cavity by applying a voltage across both of the first electrode portions of the first polysilicon fuse section to fuse the first narrowed portion; and, after the step of forming the cavity, electrically severing the second polysilicon fuse section by applying a voltage across both of the second electrode portions of the second polysilicon fuse section to fuse the second narrowed portion and make the fused polysilicon break the insulating film between the second narrowed portion and the cavity to scatter into the cavity.

In some embodiments, the method of severing the polysilicon fuse is provided as a method further including the step of positioning the first narrowed portion under the second narrowed portion before the step of forming the cavity.

According to embodiments of the invention, the first polysilicon fuse section for forming a cavity is provided in close proximity to the second polysilicon fuse section for adjusting circuit characteristics. By forming the cavity with the first polysilicon fuse section blown, fused polysilicon is contained in the cavity when the second polysilicon fuse section is blown to make it possible to stably maintain an electrical insulated state.

DETAILED DESCRIPTION

Embodiments of the invention will be explained with the following examples.

Example 1

Figure 1:
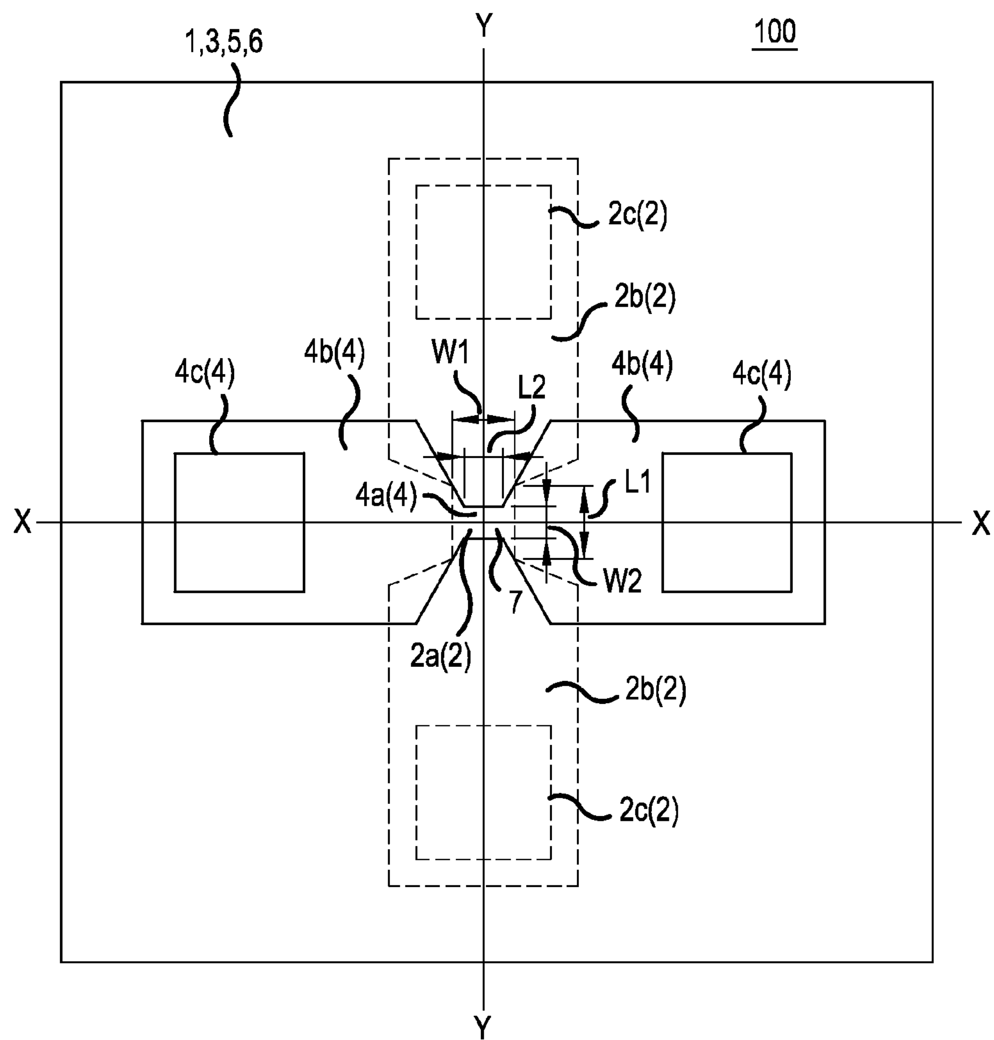
FIG. 1 is a plan view showing the structure of the principal part of a polysilicon fuse 100 according to the example 1 of the invention.
Figure 2A:
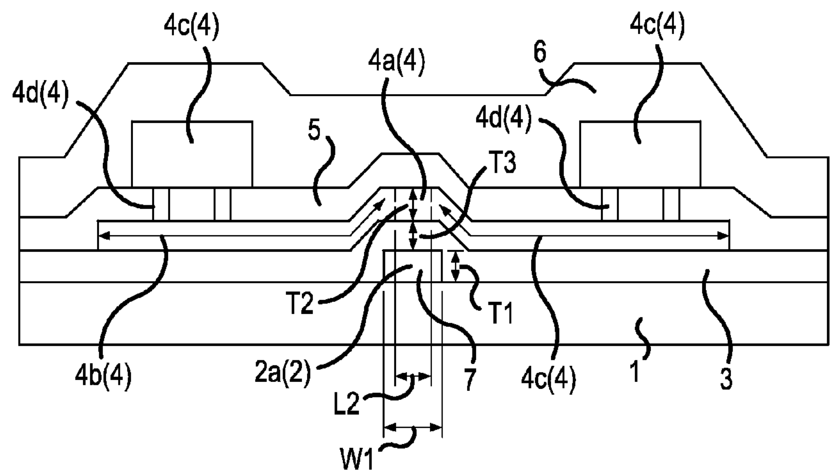
FIG. 2A is a cross sectional view cut along line X-X of FIG. 1.
Figure 2B:
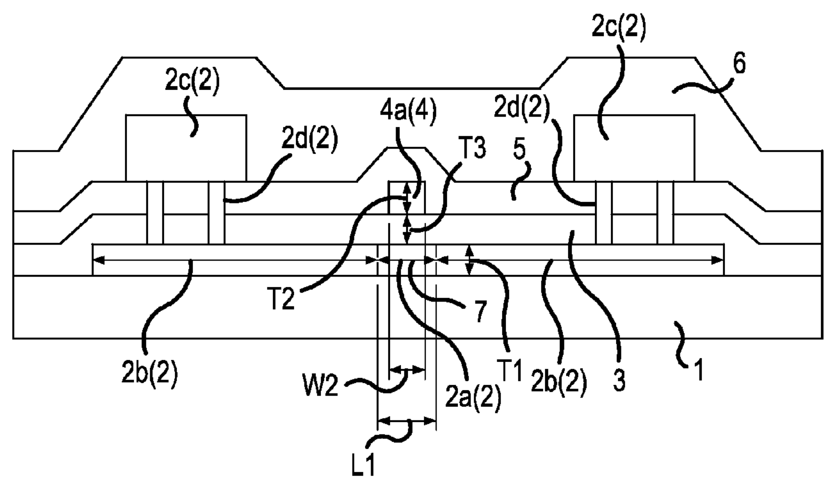
FIG. 2B is a cross sectional view cut along line Y-Y of FIG. 1.

FIG. 1 is a plan view showing the structure of the principal part of a polysilicon fuse 100 according to the example 1 of the invention. FIG. 2A is a cross sectional view cut along line X-X of FIG. 1 and FIG. 2B is a cross sectional view cut along line Y-Y of FIG. 1. The polysilicon fuse 100 is formed of a first polysilicon fuse section 2 for forming a cavity and a second polysilicon fuse section 4 for adjusting circuit characteristics. The first polysilicon fuse section 2 includes a first narrowed portion 2*a*, two first electrode portions 2*b*, two first metal electrodes 2*c* and two first via holes 2*d*. The second polysilicon fuse section 4 includes a second narrowed portion 4*a*, two second electrode portions 4*b*, two second metal electrodes 4*c* and two second via holes 4*d*.

As is shown in FIGS. 2A and 2B, the polysilicon fuse 100 is provided with an insulating layer 1, the first polysilicon fuse section 2 for forming a cavity, which section is arranged on the insulating layer 1, and an interlayer dielectric 3 arranged on the first polysilicon fuse section 2. The first polysilicon fuse section 2 is formed of a narrow first narrowed portion 2*a* and two wide first electrode portions 2*b*. In FIGS. 1, 2A and 2B, a sign W1 designates the width of the first narrowed portion 2*a*, a sign L1 designates the length of the first narrowed portion 2*a* and the sign T1 designates the thickness of the first polysilicon fuse section 2.

The polysilicon fuse 100 is further provided with the second polysilicon fuse section 4 for adjusting circuit characteristics, which section is arranged on the interlayer dielectric 3, and an interlayer dielectric 5 arranged on the second polysilicon fuse section 4 and the interlayer dielectric 3. The second polysilicon fuse section 4 is formed of a narrow second narrowed portion 4*a* and two wide second electrode portions 4*b*. In FIGS. 1, 2A and 2B, a sign W2 designates the width of the second narrowed portion 4*a*, a sign L2 designates the length of the second narrowed portion 4*a* and the sign T2 designates the thickness of the second polysilicon fuse section 4.

In the interlayer dielectric 3, arranged on the first polysilicon fuse section 2, and in the interlayer dielectric 5, two first via holes 2*d* are formed, through each of which the first metal electrode 2*c* (first fuse electrode) is provided which is connected to each of the first electrode portions 2*b*.

Moreover, in the interlayer dielectric 5, arranged on the second polysilicon fuse section 4, two second via holes 4*d* are formed, through each of which the second metal electrode 4*c* (second fuse electrode) is provided which is connected to each of the second electrode portions 4*b*.

In addition, a surface protecting film 6 is provided which is arranged on the first metal electrodes 2*c*, the second metal electrodes 4*c* and the interlayer dielectric 5. The first polysilicon fuse section 2 and second polysilicon fuse section 4 are arranged to be orthogonal to each other. The first polysilicon fuse section 2 and second polysilicon fuse section 4 intersect each other at the first narrowed portion 2*a* and second narrowed portion 4*a*, respectively, and are arranged so as to be overlaid with each other with the interlayer dielectric 3 put in between.

A voltage is applied across the first metal electrodes 2*c* to let a current flow in the first polysilicon fuse section 2 to thereby blow the first narrowed portion 2*a*. At this time, the polysilicon at the first narrowed portion 2*a* is fused and the polysilicon at each of the first electrode portions 2*b* close to the first narrowed portion 2*a* is also fused. Fused polysilicon 8, as is shown by dotted lines in FIGS. 4A and 4B which will be referred to in the later explanations, is attracted onto the side of each of the first electrode portions 2*b* by the surface tension of the fused polysilicon 8 to be severed, by which a cavity 7 surrounded by the interlayer dielectric 3 is formed at the section occupied by the first narrowed portion 2*a* and first electrode portions 2*b* close thereto. The cavity 7 is formed even though the fused polysilicon 8 is not completely severed with fused polysilicon residues 8*b* being connected.

After the cavity 7 is formed, a voltage is applied across the second metal electrodes 4*c* to let a current flow in the second polysilicon fuse section 4. Then, the polysilicon at the second narrowed portion 4*a* is fused and the fused polysilicon 8 is scattered in all directions to break the interlayer dielectric 3 to fall into the cavity 7 below together with the broken interlayer dielectric 3 to be contained in the cavity 7 as will be explained later with reference to FIG. 6B. With the fused polysilicon 8 contained in the cavity 7 in this way, the fused polysilicon residues 8*a* of the second narrowed portion 4*a* is severed, by which the second polysilicon fuse section 4 is reliably severed.

For example, like in the examples 4 that will be explained later with reference to FIG. 11 or in the example 5 that will be explained later with reference to FIG. 12, in a semiconductor device in which adjusting resistors R1 to R3, to each of which the second polysilicon fuse section 4 of the polysilicon fuse 100 is connected, and an adjusting resistor R4 are connected in parallel to form a circuit resistor R, with the second polysilicon fuse section 4 severed like in the foregoing, one of the adjusting resistors connected to the second polysilicon fuse section 4 is disconnected, by which the value of the circuit resistor R is adjusted.

The first narrowed portion 2*a* in a lower layer has a width W1 of, for example, on the order of 2 μm, a length L1 of, for example, on the order of 2 μm and a small resistance value of on the order of tens of ohms. While, the second narrowed portion 4*a* in an upper layer has a width W2 of, for example, on the order of 1 μm, a length L2 of, for example, on the order of 2 μm and a large resistance value of on the order of hundreds of ohms. Moreover, the thickness T1 of the first polysilicon fuse section 2 and the thickness T2 of the second polysilicon fuse section 4 are approximately equal to each other as being on the order of 0.5 μm to 1 μm.

The insulating layer 1 is formed by a process such as a LOCOS (Local Oxidation of Silicon) process. Moreover, the resistance value of each of the first polysilicon fuse section 2 and second polysilicon fuse section 4 is adjusted by a dose or an amount of ion implantation of impurities introduced into the polysilicon. The area of the first narrowed portion 2*a* forming the cavity 7 is preferably equal to or more than the area of the second narrowed portion 4*a*.

The interlayer dielectric 3 is formed of an oxide film such as an HTO (High Temperature Oxide) film with a thickness T3 of on the order of 0.1 μm to 0.5 μm, for example. The interlayer dielectric 3 with a thickness made to be less than 0.1 μm is sometimes broken by the blowing of the first polysilicon fuse section 2. While, the thickness in excess of 0.5 μm makes no interlayer dielectric 3 broken when the second polysilicon fuse section 4 is blown to make it impossible for the fused polysilicon 8 to be contained in the cavity 7.

Moreover, the first polysilicon fuse section 2 for forming the cavity 7, being formed on the thick insulating layer 1 formed by a process such as a LOCOS process, does not affect the semiconductor circuit formed in the semiconductor substrate beneath the insulating layer 1 by the state of blowing the first polysilicon fuse section 2.

As is explained in the foregoing, by providing the cavity 7 below the second narrowed portion 4*a* of the second polysilicon fuse section 4 for adjusting circuit characteristics, the fused polysilicon 8 is contained in the cavity 7 to be reliably severed, by which it becomes possible to stably maintain an electrically insulated state.

Figure 3A:
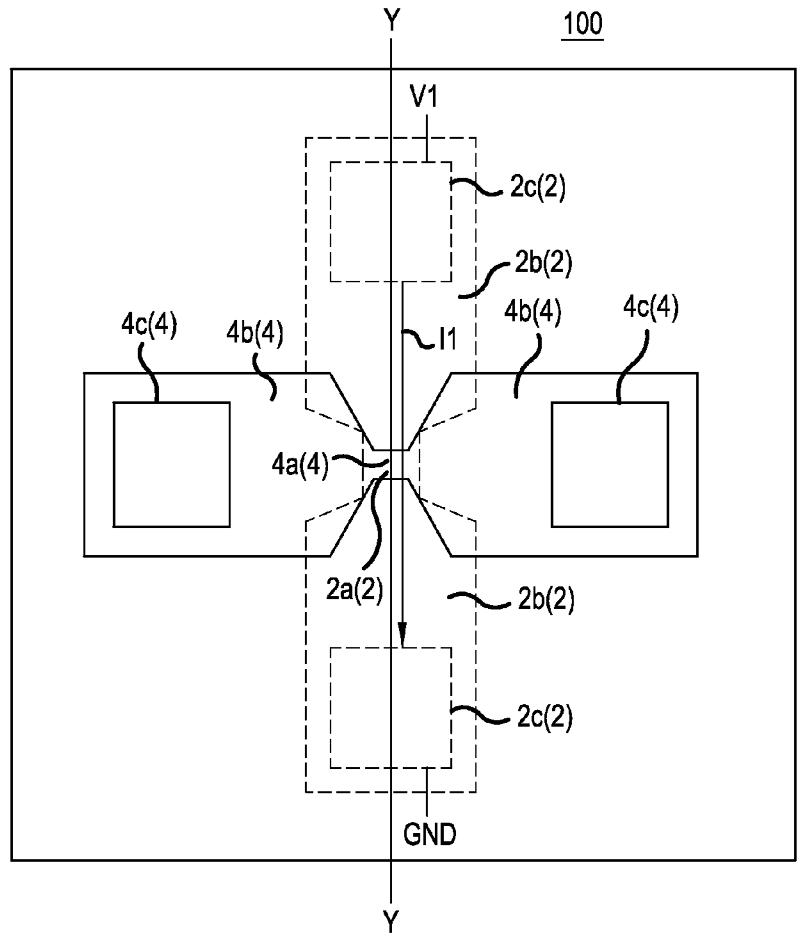
FIG. 3A is a plan view showing the principal part of the polysilicon fuse 100 at the process step of applying a voltage V1 across the first metal electrodes 2*c* to let a current I1 flow in the first polysilicon fuse section 2.
Figure 3B:
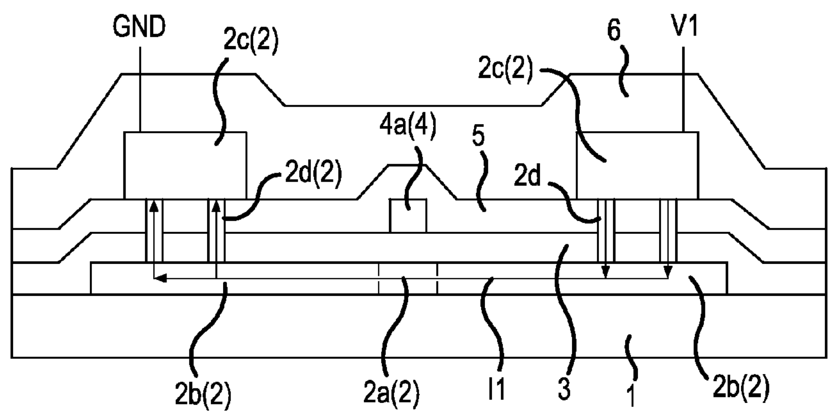
FIG. 3B is a cross sectional view cut along line Y-Y of FIG. 3A.

FIGS. 3A and 3B to 6A and 6B are views showing the polysilicon fuse 100 in process steps in trimming in order to the process step of blowing the second polysilicon fuse section 4 for adjusting circuit characteristics. FIG. 3A is a plan view showing the principal part of the polysilicon fuse 100 at the process step of applying a voltage V1 across the first metal electrodes 2*c* to let a current I1 flow in the first polysilicon fuse section 2. FIG. 3B is a cross sectional view cut along line X-X of FIG. 3A.

As is shown in FIGS. 3A and 3B, a voltage V1 is applied across the first metal electrodes 2*c* to let a current I1 flow in the first polysilicon fuse section 2 for forming a cavity. The current I1, as is shown by arrows in FIGS. 3A and 3B, flows from the first metal electrode 2*c* (on the upper side in FIG. 3A and on the right side in FIG. 3B) to the first metal electrode 2*c* (on the lower side in FIG. 3A and on the left side in FIG. 3B) via the first electrode portion 2*b* (on the upper side in FIG. 3A and on the right side in FIG. 3B), the first narrowed portion 2*a* and the first electrode portion 2*b* (on the lower side in FIG. 3A and on the left side in FIG. 3B).

Figure 4A:
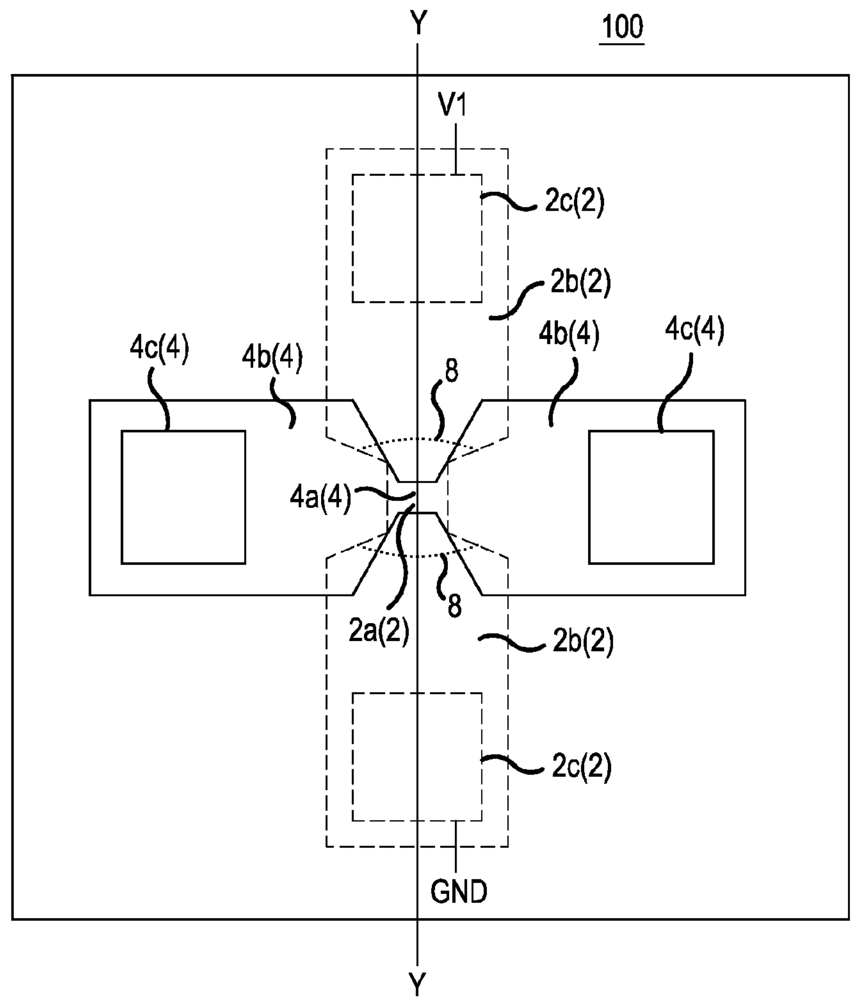
FIG. 4A is a plan view showing the principal part of the polysilicon fuse 100 at the process step at which the polysilicon is fused subsequent to the process step shown in FIGS. 3A and 3B.
Figure 4B:
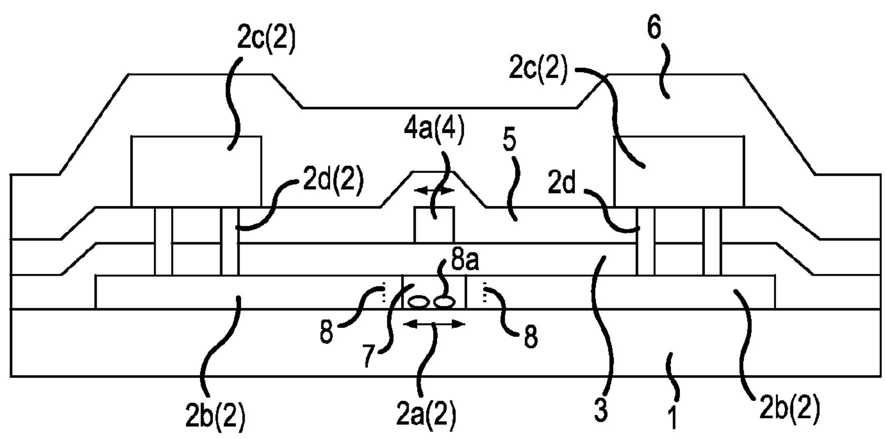
FIG. 4B is a cross sectional view cut along line Y-Y of FIG. 4A.

Subsequent to this, as was explained in the foregoing, by the joule heat due to the current I1, the polysilicon in the first narrowed portion 2*a* and first electrode portions 2*b* close to the first narrowed portion 2*a* fuses. FIG. 4A is a plan view showing the principal part of the polysilicon fuse 100 at the process step at which the polysilicon is fused subsequent to the process step shown in FIGS. 3A and 3B. FIG. 4B is a cross sectional view cut along line Y-Y of FIG. 4A.

As is shown by dotted lines in FIGS. 4A and 4B, fused polysilicon 8 is attracted onto the side of each of the first electrode portions 2*b* by the surface tension of the fused polysilicon 8 to be severed, by which a cavity 7 surrounded by the interlayer dielectric 3 is formed at the section occupied by the first narrowed portion 2*a* and first electrode portions 2*b* close thereto. At this time, the cavity 7 is formed even though the fused polysilicon 8 is not completely severed with fused polysilicon residues 8*b* being connected.

Figure 5A:
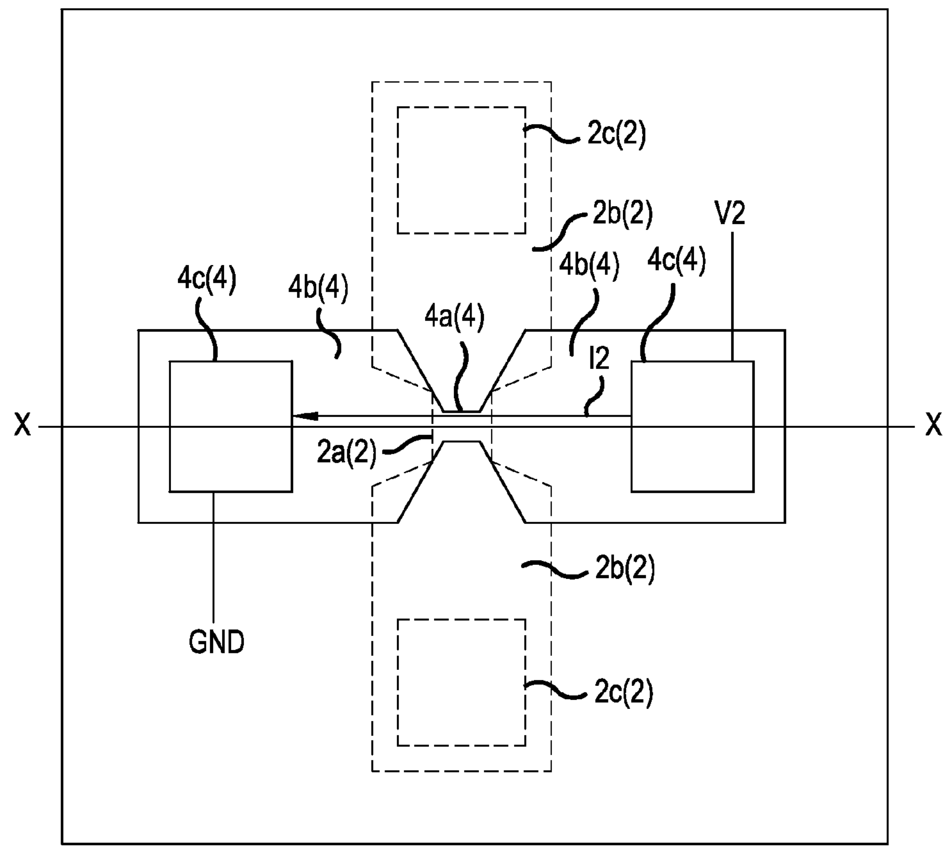
FIG. 5A is a plan view showing the principal part of the polysilicon fuse 100 at the process step of applying a voltage V2 across the second metal electrodes 4*c* of the second polysilicon fuse section 4 to let a current I2 flow in the second polysilicon fuse section 4 subsequent to the process step shown in FIGS. 4A and 4B.
Figure 5B:
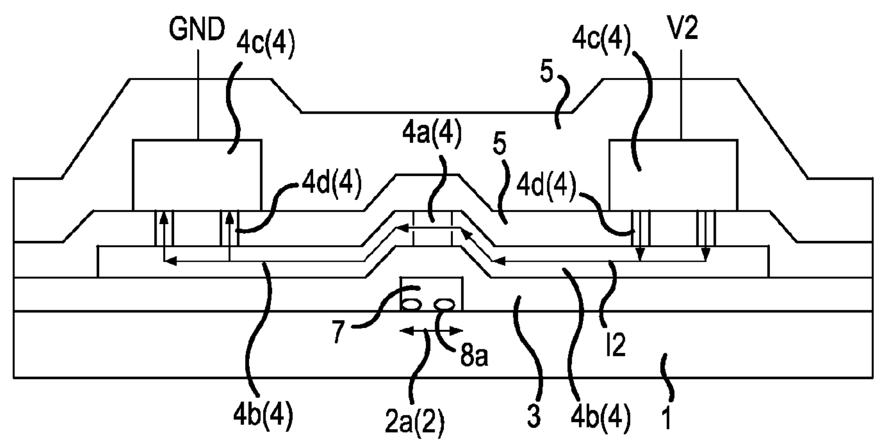
FIG. 5B is a cross sectional view cut along line X-X of FIG. 5A.

FIG. 5A is a plan view showing the principal part of the polysilicon fuse 100 at the process step of applying a voltage V2 across the second metal electrodes 4*c* of the second polysilicon fuse section 4 to let a current I2 flow in the second polysilicon fuse section 4 subsequent to the process step shown in FIGS. 4A and 4B. FIG. 5B is a cross sectional view cut along line X-X of FIG. 5A. As is shown in FIGS. 5A and 5B, the voltage V2 higher than the voltage V1 is applied across the second metal electrodes 4*c* to let a current I2 flow in the polysilicon at the second narrowed portion 4*a* in the second polysilicon fuse section 4 for adjusting circuit characteristics.

Figure 6A:
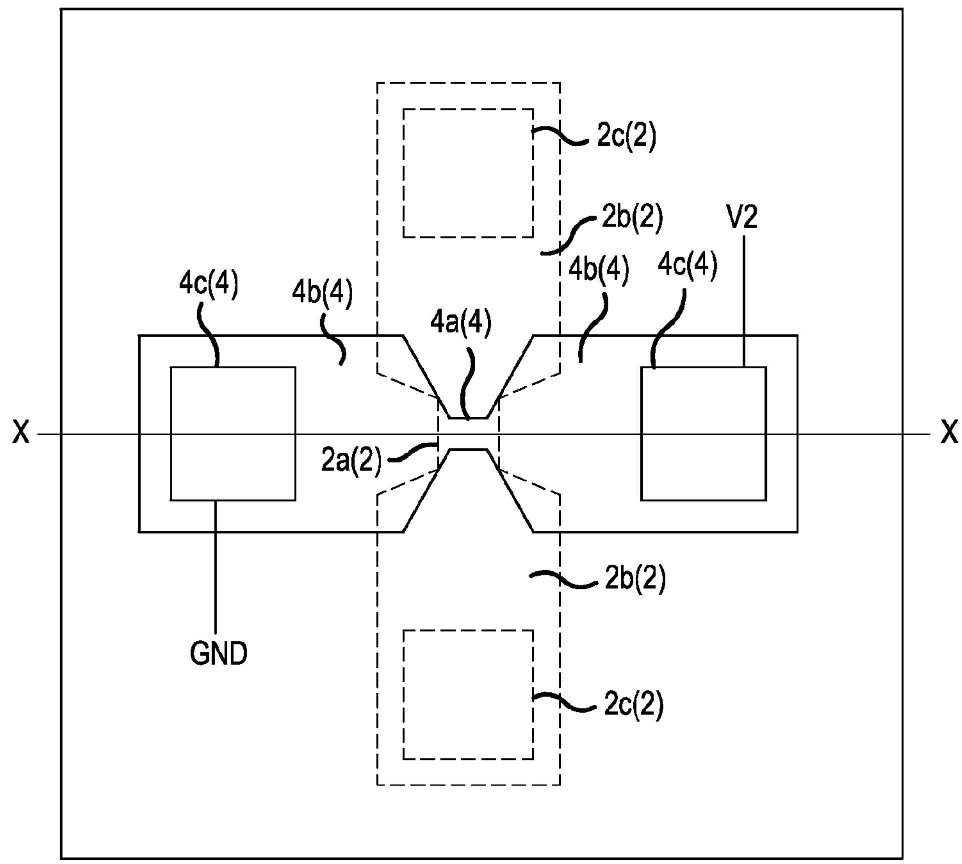
FIG. 6A is a plan view showing the principal part of the polysilicon fuse 100 at the process step at which the polysilicon at the second narrowed portion 4*a* in the second polysilicon fuse section 4 is made to be fused and scattered subsequent to the process step shown in FIGS. 5A and 5B.
Figure 6B:
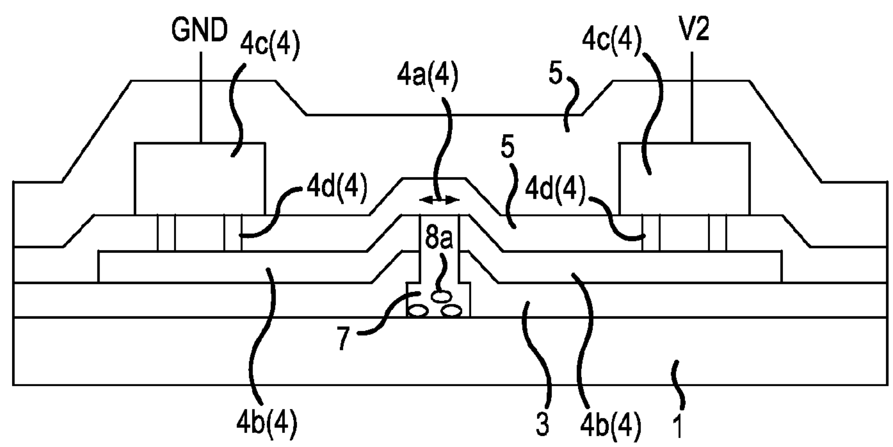
FIG. 6B is a cross sectional view cut along line X-X of FIG. 6A.

FIG. 6A is a plan view showing the principal part of the polysilicon fuse 100 at the process step at which the polysilicon at the second narrowed portion 4*a* in the second polysilicon fuse section 4 is made to be fused and scattered subsequent to the process step shown in FIGS. 5A and 5B. FIG. 6B is a cross sectional view cut along line X-X of FIG. 6A. As is shown in FIGS. 6A and 6B, the fused polysilicon 8 at the second narrowed portion 4*a* is scattered (broken) together with the interlayer dielectric 3 below to fall in the cavity 7, by which the fused polysilicon residues 8*a* of the second narrowed portion 4*a* in the second polysilicon fuse section 4 is reliably severed. Thus, connection of residues due to migration can be prevented even at a high temperature to make it possible to stably obtain an electrically insulated state. As a result, the polysilicon fuse 100 can be obtained with high reliability.

Figure 7A:
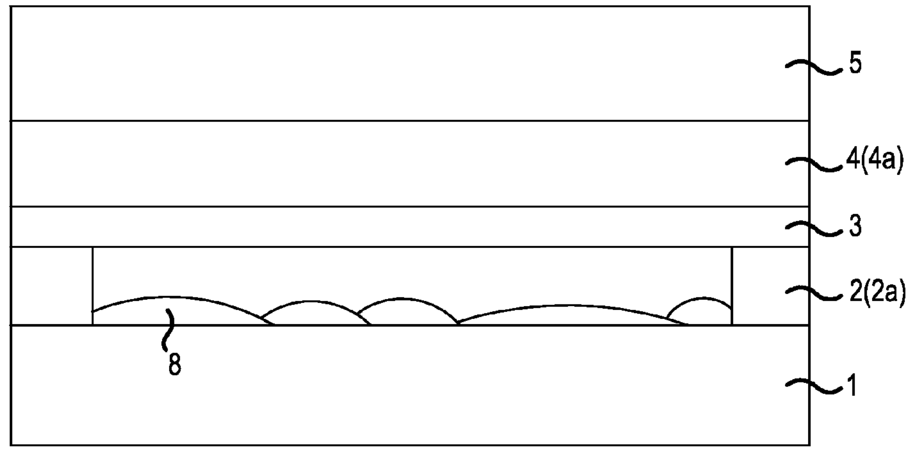
FIG. 7A is a cross sectional view showing a state in which the cavity 7 is formed only in the first polysilicon fuse section 2 before the second narrowed portion 4*a* in the second polysilicon fuse section 4 is blown.
Figure 7B:
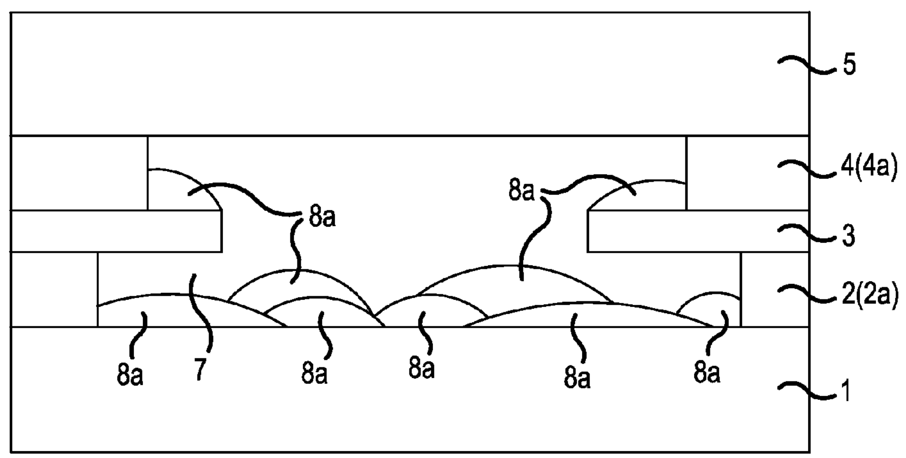
FIG. 7B is a cross sectional view showing a state in which the second narrowed portion 4*a* is blown.

FIG. 7A is a cross sectional view showing a state in which the cavity 7 is formed only in the first polysilicon fuse section 2 before the second narrowed portion 4*a* in the second polysilicon fuse section 4 is blown. FIG. 7B is a cross sectional view showing a state in which the second narrowed portion 4*a* is blown.

As is shown in FIG. 7A, even though the fused polysilicon 8 is not severed, when the second polysilicon fuse section 4 for adjusting circuit characteristics is blown, the fused polysilicon 8 falls into the cavity 7 to be contained therein as is shown in FIG. 7B, by which the second polysilicon fuse section 4 is reliably severed.

In the example 1, the second polysilicon fuse section 4 for adjusting circuit characteristics is fused with the first polysilicon fuse section 2 for forming a cavity being positioned under the second polysilicon fuse section 4 for forming a cavity. In such a case, even though the second polysilicon fuse section 4 for adjusting circuit characteristics is not completely fused, the second polysilicon fuse section 4 that is not completely fused falls into the cavity 7 together with the broken interlayer dielectric 3. Hence, the second polysilicon fuse section 4 can be reliably severed.

Figure 8A:
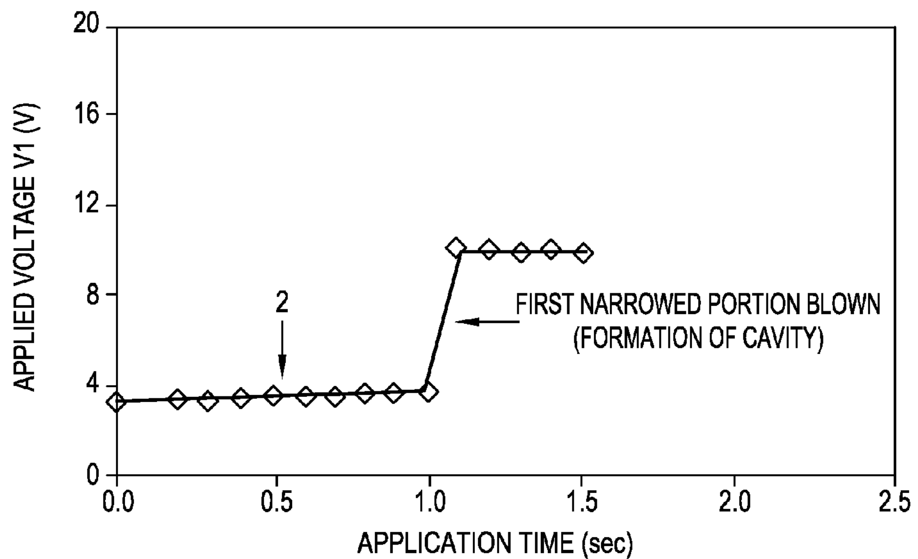
FIG. 8A is a diagram showing a relationship between an applied voltage and an application time thereof when the first polysilicon fuse section 2 of the polysilicon fuse 100 is blown.
Figure 8B:
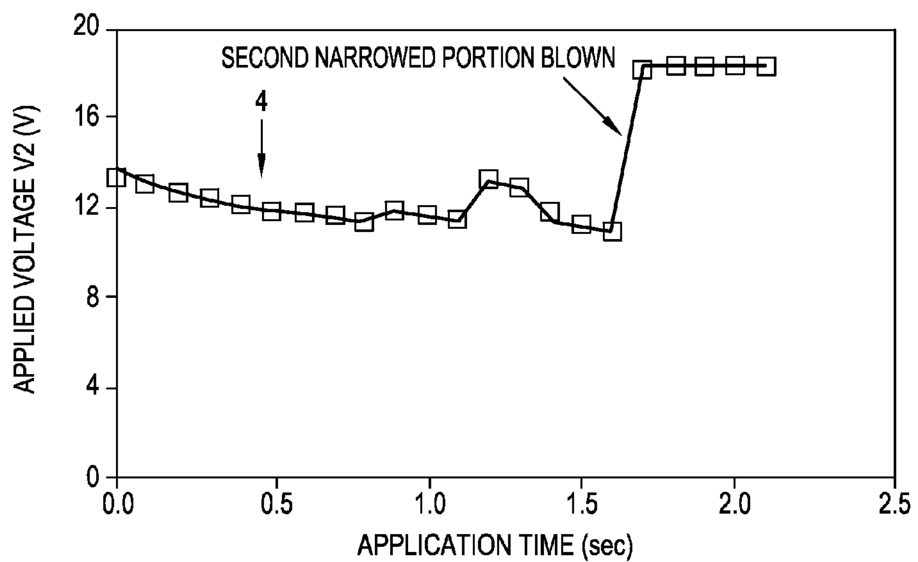
FIG. 8B is a diagram showing a relationship between an applied voltage and an application time thereof when the second polysilicon fuse section 4 of the polysilicon fuse 100 is blown.

FIG. 8A is a diagram showing a relationship between an applied voltage and an application time thereof when the first polysilicon fuse section 2 of the polysilicon fuse 100 is blown. FIG. 8B is a diagram showing a relationship between an applied voltage and an application time thereof when the second polysilicon fuse section 4 of the polysilicon fuse 100 is blown.

As is shown in FIG. 8A, a voltage V1 (=10V) is applied across the first metal electrodes 2*c* of the first polysilicon fuse section 2 to let a current I1 of 30 mA (here, I1 is a constant current) flow from one of the first metal electrodes 2*c* to the first narrowed portion 2*a* of the first polysilicon fuse section 2 for forming a cavity. The constant current I1 lowers the applied voltage V1 to a voltage less than 4V. The first narrowed portion 2*a* is heated by the joule heat due to the current I1 to be blown in 1 second, by which the cavity 7 is formed and the applied voltage V1 returns to 10V. The current I1 being increased causes the interlayer dielectric 3 to be broken when the first narrowed portion 2*a* is blown to adversely affect the second narrowed portion 4*a*. Therefore, it is not preferable to excessively increase the current I1 that is made to flow in the first narrowed portion 2*a*.

As is shown in FIG. 8B, after the polysilicon fuse 100 is blown to form the cavity 7, a voltage V2 (=18V) is applied across the second metal electrodes 4*c* of the second polysilicon fuse section 4 to let a current I2 of 40 mA (here, I2 is a constant current) flow in the second polysilicon fuse section 4. The constant current I2 lowers the applied voltage V2 to a voltage less than 14V. By the current I2, the second narrowed portion 4*a* is blown in 1.6 seconds. The fused polysilicon 8 is contained in the cavity 7, by which the second polysilicon fuse section 4 comes to stably maintain an electrically insulated state and the applied voltage V2 returns to 18V. As a result, the polysilicon fuse 100 can stably maintain the electrically insulated state.

Example 2

Figure 9A:
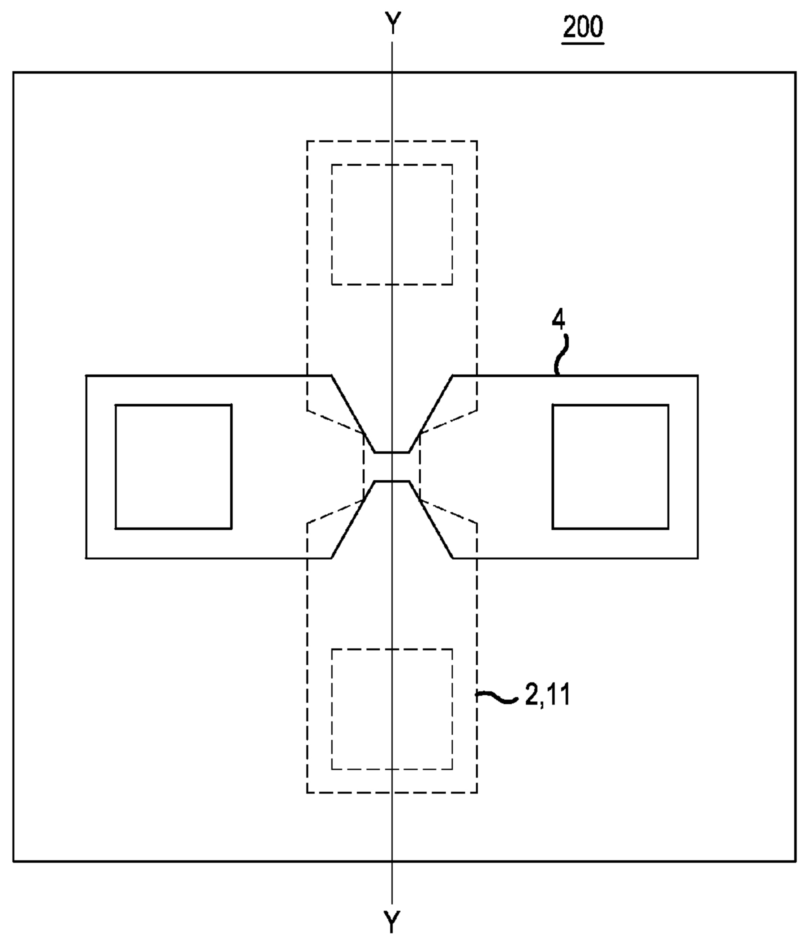
FIG. 9A is a plan view showing the structure of the principal part of a semiconductor device 200 according to the example 2 of the invention.
Figure 9B:
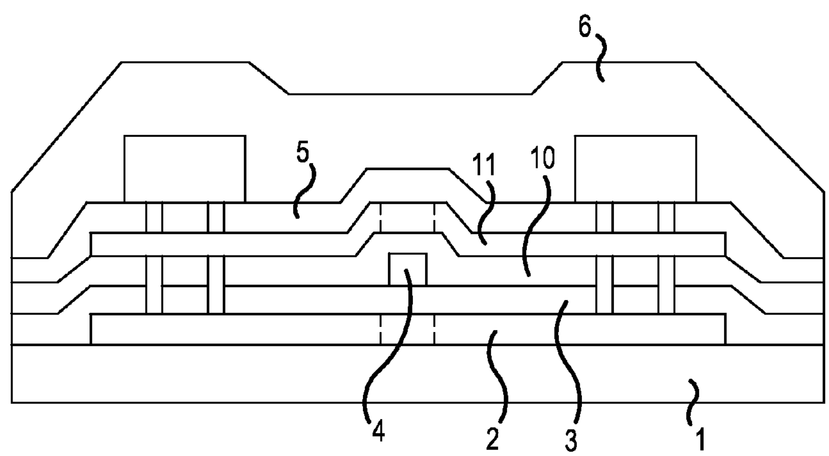
FIG. 9B is a cross sectional view cut along line Y-Y of FIG. 9A.

FIG. 9A is a plan view showing the structure of the principal part of a semiconductor device 200 according to the example 2 of the invention. FIG. 9B is a cross sectional view cut along line Y-Y of FIG. 9A.

The difference from the polysilicon fuse 100 is that another first polysilicon fuse section 11 is arranged above the second polysilicon fuse section 4 with an interlayer dielectric 10 put in between. The first polysilicon fuse section 11 in an upper layer is arranged just above the first polysilicon fuse section 2 in a lower layer in a shape identical to the shape of the first polysilicon fuse section 2. With the arrangement, the cavity 7 is arranged on both the upper and lower sides of the second polysilicon fuse section 4. This can further improve the state of insulation better than that in the case shown in FIG. 1.

Of course, even with the first polysilicon fuse section 11 in the upper layer alone, an effect can be obtained which is similar to the effect obtained by the first polysilicon fuse section 2 shown in FIG. 1. This is because fused and blown polysilicon is scattered in all directions regardless of the action of gravity to be effectively contained in a cavity even when the cavity is positioned above the second polysilicon fuse section 4.

Example 3

Figure 10A:
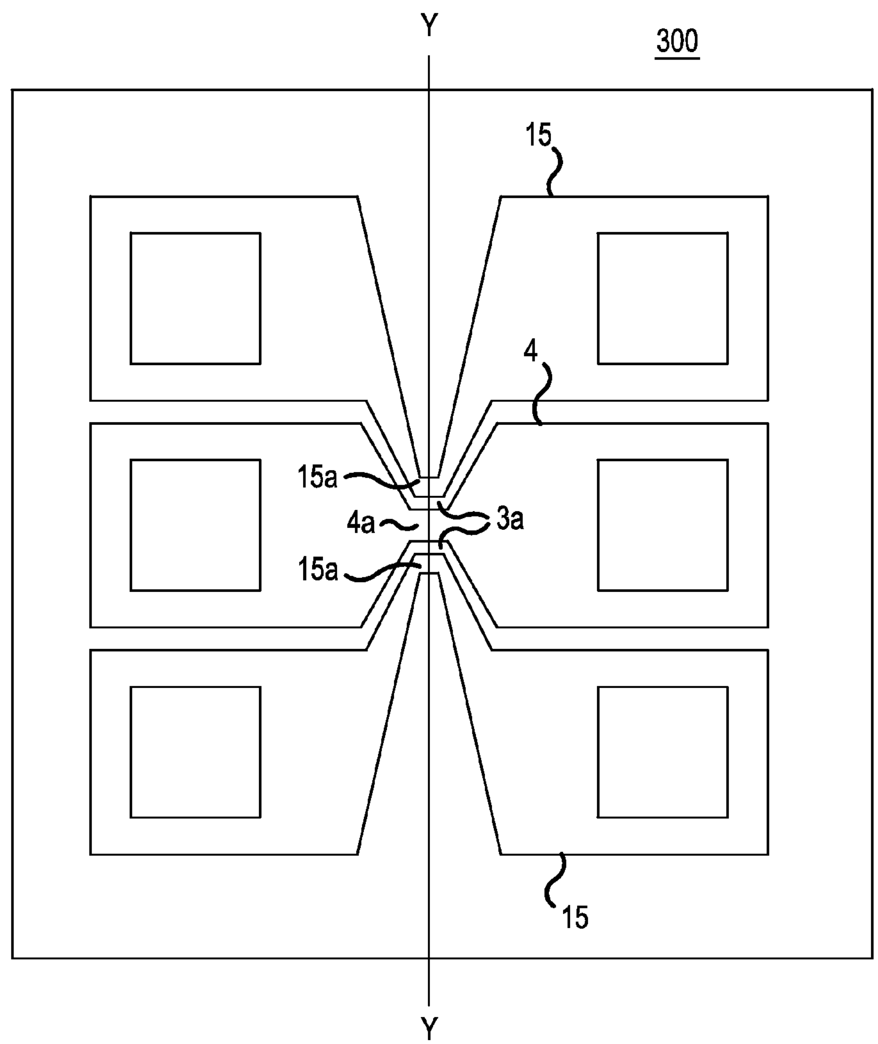
FIG. 10A is a plan view showing the structure of the principal part of a semiconductor device 300 according to the example 3 of the invention.
Figure 10B:
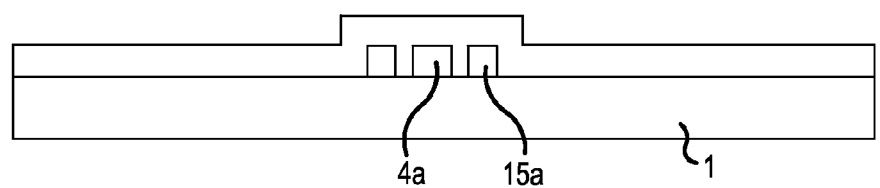
FIG. 10B is a cross sectional view cut along line Y-Y of FIG. 10A.

FIG. 10A is a plan view showing the structure of the principal part of a semiconductor device 300 according to the example 3 of the invention. FIG. 10B is a cross sectional view cut along line Y-Y of FIG. 10A.

The example 3 differs from the examples 1 and 2 in that a first polysilicon fuse section 15 is arranged on each side of the second polysilicon fuse section 4 in close proximity thereto. An interlayer dielectric 3*a* (a dielectric equivalent to the interlayer dielectric 3) separating a first narrowed portion 15*a* of the first polysilicon fuse section 15, which portion is to form a cavity 7, from the second narrowed portion 4*a* of the second polysilicon fuse section 4 for adjusting circuit characteristics on each side of the second narrowed portion 4*a* is preferably thinner because of easiness in being broken. Moreover, it is also possible to modify the polysilicon fuse 300 so that the second polysilicon fuse section 4 has the first polysilicon fuse sections 2 arranged below and the first polysilicon fuse section 11 arranged above like in the example 2 and, to the arrangement, the first polysilicon fuse section 15 is arranged on each lateral side of the second polysilicon fuse section 4.

The feature of the modification of the polysilicon fuse 300 according to the example 3 of the invention is that the first narrowed portions 2*a* and 15*a* of the first polysilicon fuse sections 2 and 15, respectively, for forming a cavity are fused to form the cavity 7, which is arranged around the second narrowed portion 4*a* of the second polysilicon fuse section 4 in close proximity thereto.

Example 4

Figure 11:
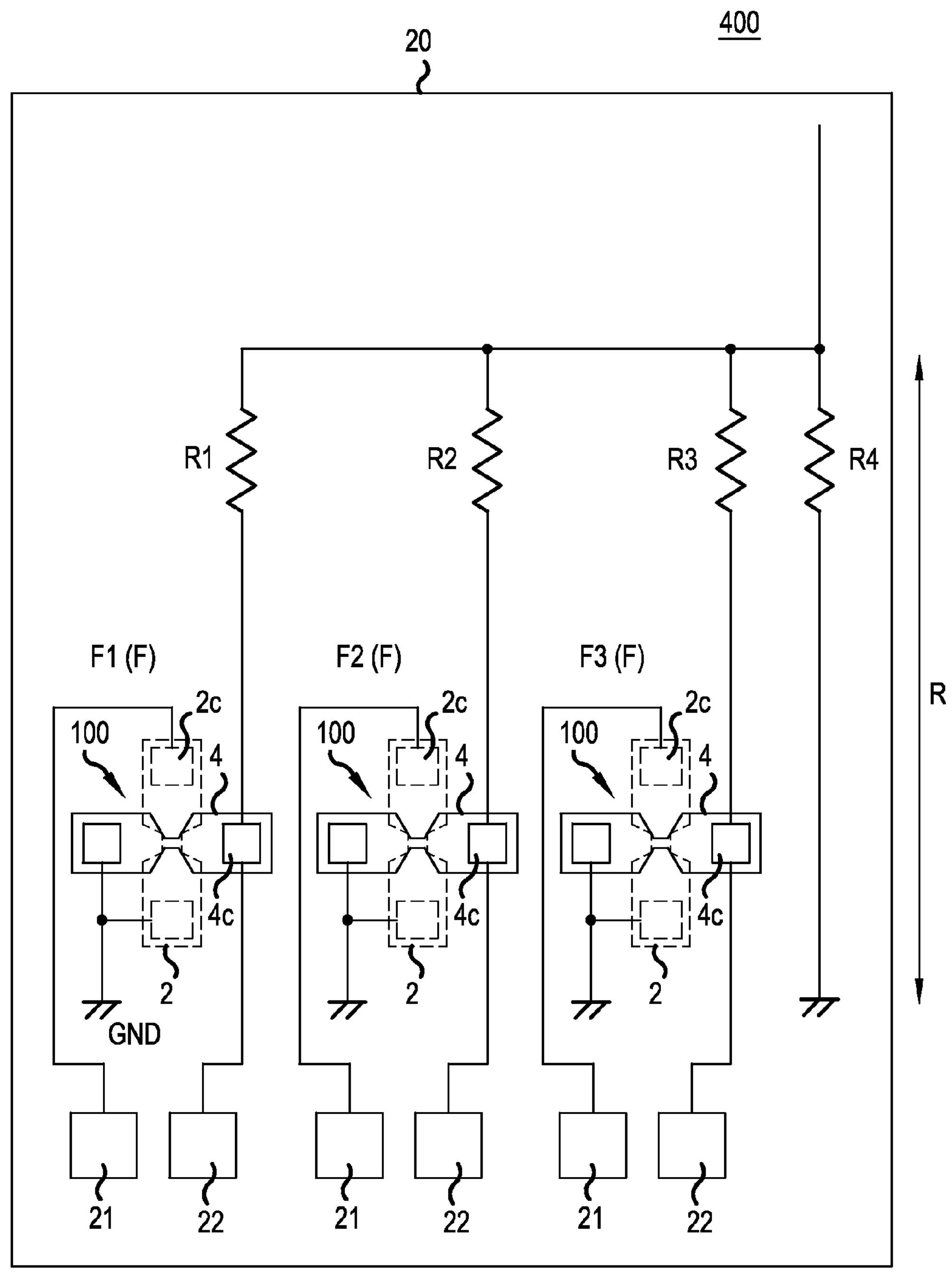
FIG. 11 is a view showing the configuration of a semiconductor device 400 having polysilicon fuses as the example 4 according to the invention.

FIG. 11 is a view showing the configuration of a semiconductor device 400 having polysilicon fuses as the example 4 according to the invention. The semiconductor device 400 is provided with a semiconductor circuit, which includes on a semiconductor substrate 20 a plurality of adjusting resistors R1 to R4 connected in parallel for adjusting circuit characteristics and the polysilicon fuse 100 including the first polysilicon fuse section 2 and second polysilicon fuse section 4 which fuse is connected to each of the adjusting resistors R1 to R3 of the adjusting resistors R1 to R4. A sign R designates a circuit resistor formed with the adjusting resistor R4 and some of the adjusting resistors R1 to R3 connected in parallel to be adjusted so as to have a resistance value for giving appropriate circuit characteristics. Of the adjusting resistors R1 to R4, the adjusting resistor R4 is a fixed resistor and the adjusting resistors R1 to R3 are resistors for making an adjustment of reducing the resistance value of the adjusting resistor R4. The adjustment of the resistance value of the circuit resistor R is carried out by blowing the first polysilicon fuse section 2 and second polysilicon fuse section 4 of the polysilicon fuse 100 connected to each of some or all of the adjusting resistors R1 to R3 to disconnect them from the ground GND.

The polysilicon fuse 100 including the first polysilicon fuse section 2 and second polysilicon fuse section 4 forms a trimming fuse F as each of trimming fuses F1 to F3 for trimming. Moreover, with some of the adjusting resistors R1 to R3 connected to the ground GND through the second polysilicon fuse sections 4 after trimming (adjustment) and the second polysilicon fuse sections 4 connecting the adjusting resistors to the ground GND, the circuit resistor R (resistor forming an integrated circuit etc.) is formed.

The configuration of the semiconductor device 400 will be explained with reference to FIG. 11 and FIGS. 2A and 2B showing example 1. As is shown in FIGS. 2A and 2B, on the semiconductor substrate 20, the insulating layer 1 formed by, for example, LOCOS process is arranged and, on the insulating layer 1, the first polysilicon fuse section 2 is arranged. Above the first polysilicon fuse section 2, the second polysilicon fuse section 4 is arranged with the interlayer dielectric 3 put in between. On the second polysilicon fuse section 4, the interlayer dielectric 5 and surface protecting film 6 are arranged. While, as is shown in FIG. 11, on the periphery of the semiconductor substrate 20, a plurality of first trimming pads 21 and a plurality of second trimming pad 22 are arranged. Each of the first trimming pads 21 is connected to its own polysilicon fuse 100 at one of the first metal electrodes 2*c* of the first polysilicon fuse section 2 therein and each of the second trimming pad 22 is connected to its own polysilicon fuse 100 at one of the second metal electrodes 4*c* of the second polysilicon fuse sections 4 therein.

Here, four adjusting resistors R1 to R4 (each having a resistance value of tens of kilohms or more, for example) are provided which are connected to one another at one end of each of them. The other end of each of the adjusting resistors R1 to R3 is connected to the ground GND through the second polysilicon fuse section 4. While, the other end of the adjusting resistor R4 is directly connected to the ground GND.

In the next, the operation of the semiconductor device 400 will be explained. A voltage V1 is applied to the first trimming pad 21 connected to the polysilicon fuse 100 as the trimming fuse F1 connected to the adjusting resistor R1 to let a current I1 (here, a constant current) flow in the first polysilicon fuse section 2 toward the ground GND to blow the first polysilicon fuse section 2 to thereby form a cavity 7. Following this, a voltage V2 is applied to the second trimming pad 22 to let a current I2 (here, a constant current) flow in the second polysilicon fuse section 4 toward the ground GND to blow the second polysilicon fuse section 4. The blown polysilicon of the second polysilicon fuse section 4 is contained in the cavity 7, by which the second polysilicon fuse section 4 is reliably severed. Hence, the polysilicon fuse 100 can stably maintain an insulated state. The voltages V1 and V2, and the currents I1 and I2 have been explained with reference to FIGS. 8A and 8B.

When further adjustment of the resistance value becomes necessary, the voltage V1 is applied to the first trimming pad 21 connected to the polysilicon fuse 100 as the trimming fuse F2 connected to the adjusting resistor R2 to let the constant current I1 flow in the first polysilicon fuse section 2 toward the ground GND to blow the first polysilicon fuse section 2 to thereby form a cavity 7. Following this, the voltage V2 is applied to the second trimming pad 22 to let the constant current I2 flow in the second polysilicon fuse section 4 toward the ground GND to blow the second polysilicon fuse section 4. When still further adjustment of the resistance value becomes necessary, a similar operation is repeated with respect to the adjusting resistor R3, by which the resistance value of the circuit resistor R can be adjusted.

Example 5

Figure 12:
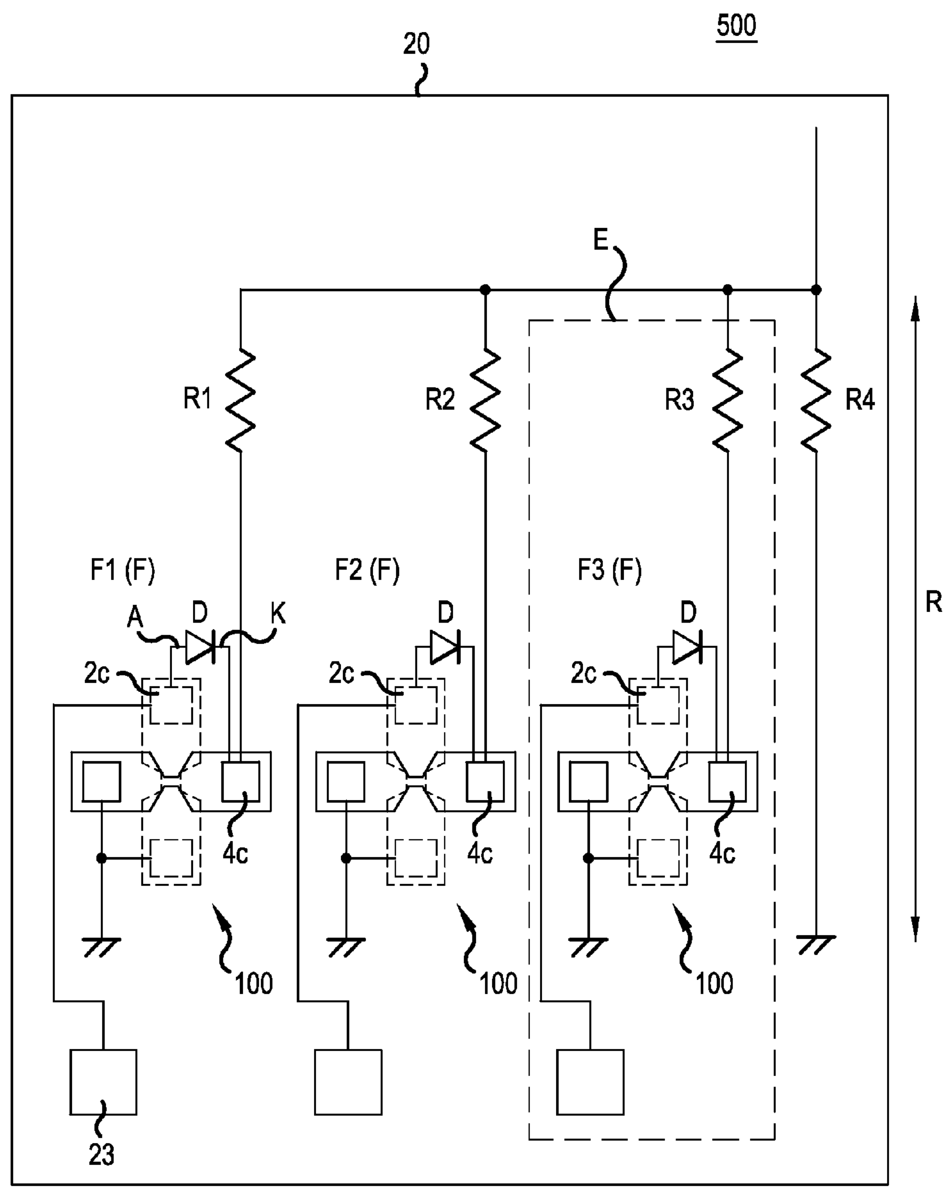
FIG. 12 is a view showing the configuration of a semiconductor device 500 having polysilicon fuses as the example 5 according to the invention.

FIG. 12 is a view showing the configuration of a semiconductor device 500 having polysilicon fuses as an example 5 according to the invention. The difference from the semiconductor device 400 shown in FIG. 11 is that in each of polysilicon fuses, a diode D is provided between one of the first metal electrodes 2*c* of the first polysilicon fuse section 2 and one of the of the second metal electrodes 4*c* of the second polysilicon fuse section 4 and the second trimming pad 22 shown in FIG. 11 is omitted with only one trimming pad 23 used, by which the number of trimming pad is reduced in half.

The cathode K of the diode D is connected to the one of the second metal electrodes 4*c* of the second polysilicon fuse section 4 and the anode A of the diode D is connected to the one of the first metal electrodes 2*c* of the first polysilicon fuse section 2.

In the semiconductor device 500, the first trimming pad 21 connected to one of the first metal electrodes 2*c* of the first polysilicon fuse section 2 and the second trimming pad 22 connected to one of the second metal electrodes 4*c* of the second polysilicon fuse section 4 in the semiconductor device 400 in the example 4 are made to be in one piece of a trimming pad 23 that is common to the first polysilicon fuse section 2 and the second polysilicon fuse section 4. This can provide a smaller occupied area of the semiconductor device 500 compared with the occupied area of the semiconductor device 400 in the example 4.

Figure 13:
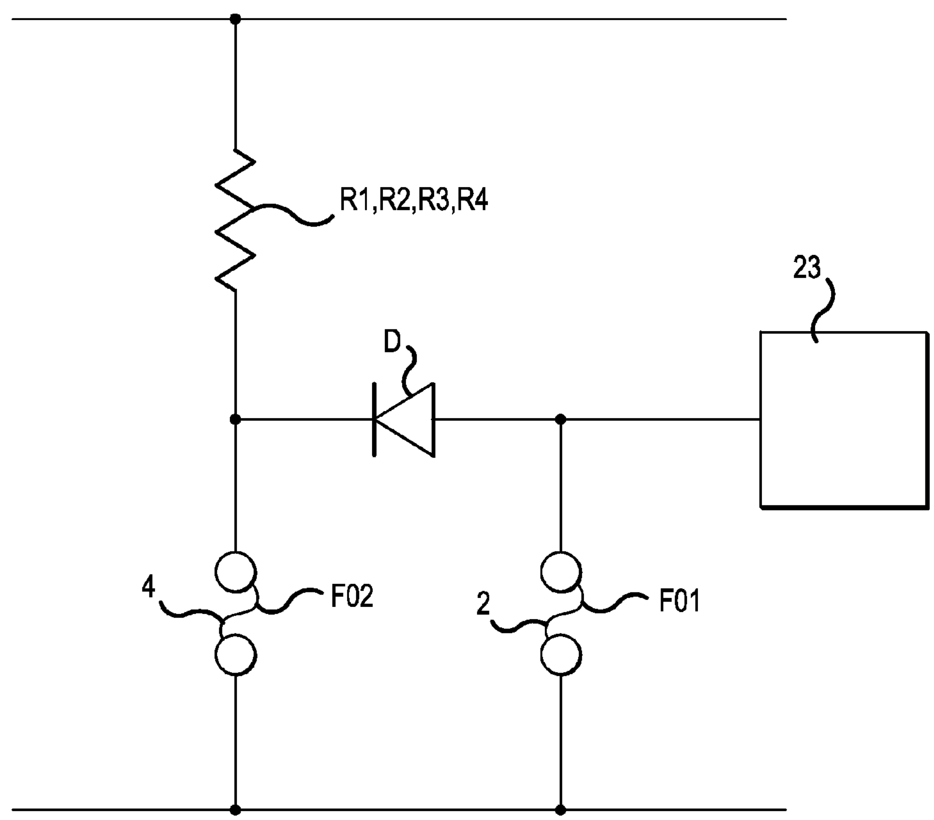
FIG. 13 is an equivalent circuit diagram of the section E in the semiconductor device 500 shown in FIG. 12.

FIG. 13 is an equivalent circuit diagram of the section E in the semiconductor device 500 shown in FIG. 12. In FIG. 13, the first polysilicon fuse section 2 and second polysilicon fuse section 4 are represented by signs of fuses as F01 and F02, respectively.

Figure 14:
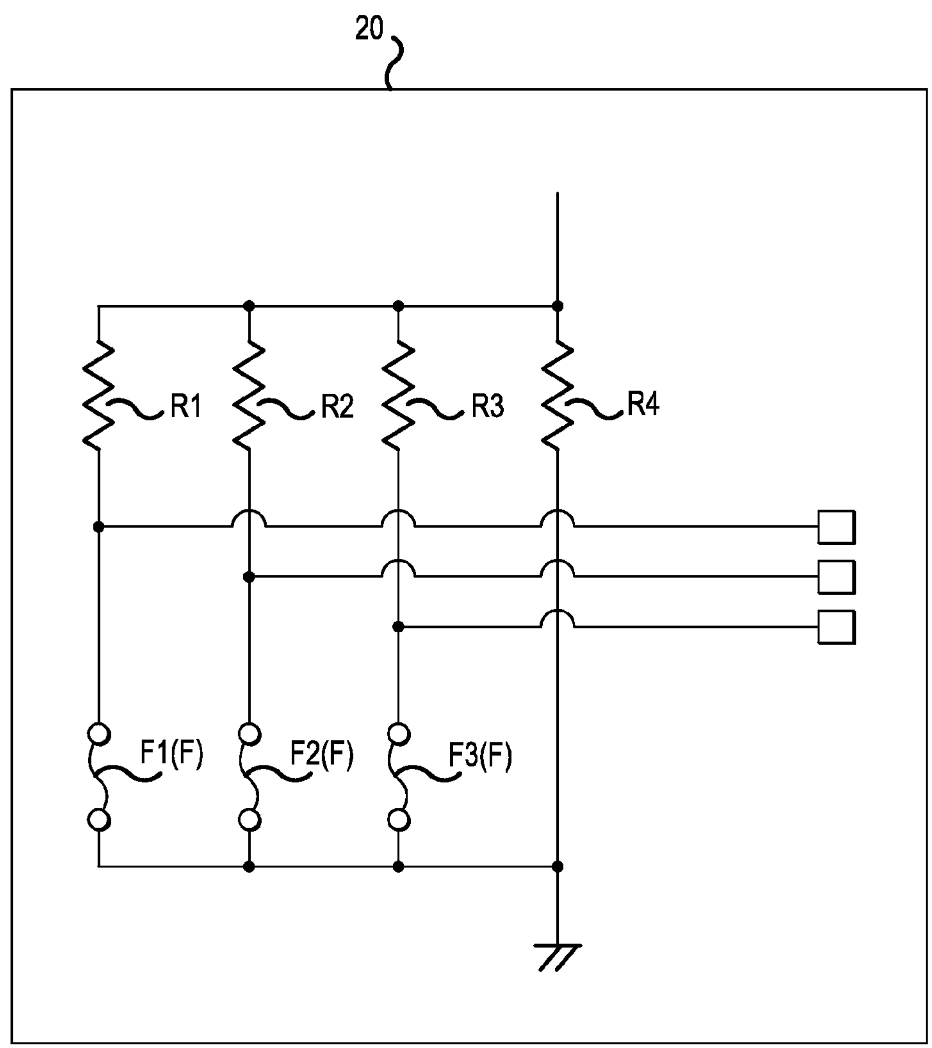
FIG. 14 is an equivalent circuit diagram of FIG. 12 in which diagram the first polysilicon fuse section 2, second polysilicon fuse section 4 and diode D are brought together to be represented as a fuse F as each of the trimming fuses F1 to F3.

FIG. 14 is an equivalent circuit diagram of FIG. 12 in which diagram the first polysilicon fuse section 2, second polysilicon fuse section 4 and diode D are brought together to be represented as a fuse F as each of the trimming fuses F1 to F3.

Figure 15:
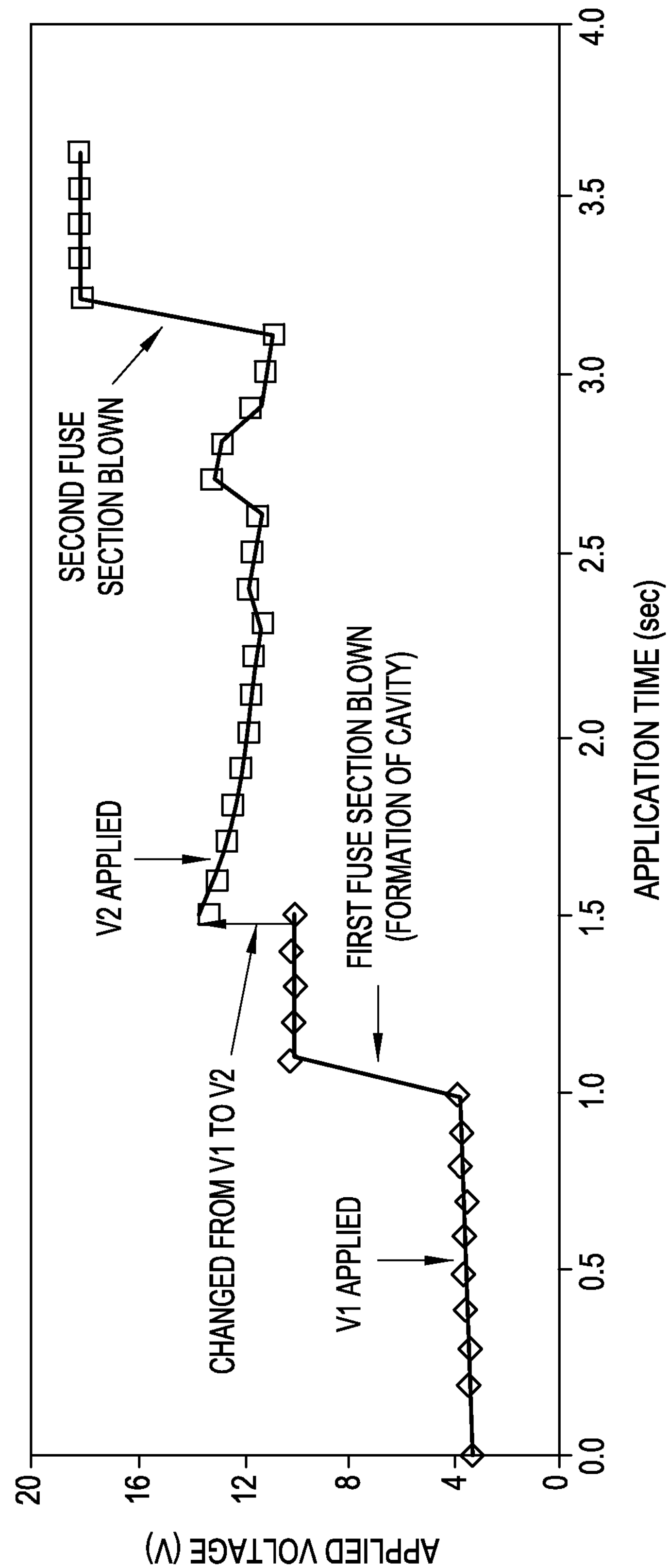
FIG. 15 is a diagram showing a relationship between an applied voltage and an application time thereof when the first polysilicon fuse section 2 and second polysilicon fuse section 4 used in the semiconductor device 500 shown in FIG. 12 are blown.
Figure 16A:
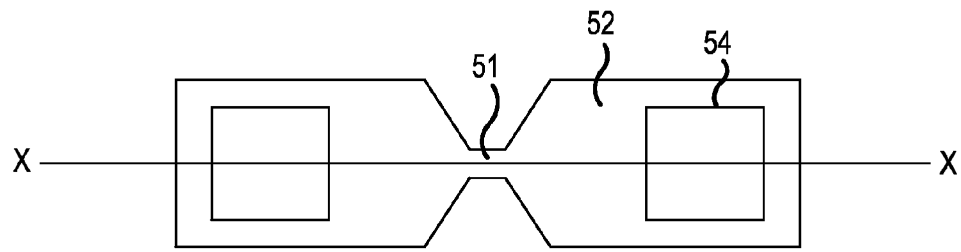
FIG. 16A is a plan view showing the structure of the principal part of a related polysilicon fuse 600.
Figure 16B:
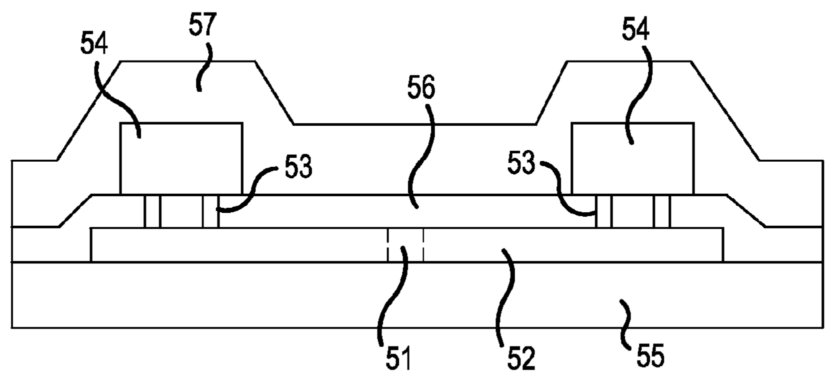
FIG. 16B is a cross sectional view cut along line X-X of FIG. 16A.
Figure 17:
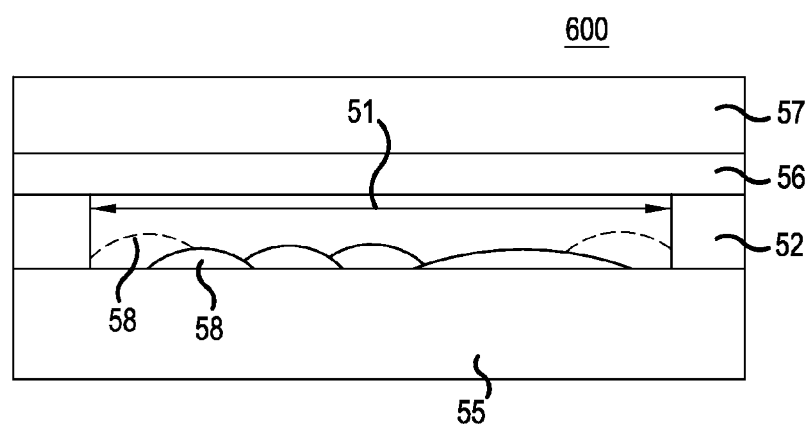
FIG. 17 is an enlarged cross sectional view showing the narrowed portion 51 after blowing of the polysilicon fuse 600.

FIG. 15 is a diagram showing a relationship between an applied voltage and an application time thereof when the first polysilicon fuse section 2 and second polysilicon fuse section 4 used in the semiconductor device 500 shown in FIG. 12 are blown.

When a voltage V1, for example, is applied to one of the trimming pads 23 to let a current I1 of 30 mA (here, a constant current) flow in the first polysilicon fuse section 2 (F01) for forming a cavity, only the first polysilicon fuse section 2 (F01) is blown after 1 sec to form a cavity 7, by which the voltage V1 leaps up. Subsequent to this, at the time of 1.5 sec, the applied voltage is switched from V1 to V2 to let a current I2 of 40 mA (here, a constant current) flow in the second polysilicon fuse section 4 (F02). Then, the second polysilicon fuse section 4 (F02) is blown after 3.2 sec, by which the voltage V2 leaps up.

By the blowing, one of the adjusting resistors R1 to R3 is disconnected to increase the value of the circuit resistor R, which is thus adjusted. When the adjustment is insufficient, the foregoing operation is further repeated. The diode D acts as a means for disconnecting an insufficiently severed first polysilicon fuse section 2 for forming a cavity from the circuit resistor R.

As was explained in the foregoing, according to the invention, fused polysilicon is contained in the cavity 7 to inhibit change in characteristics (for example, an increase in a leak current) due to migration even in an operation at a high temperature, by which semiconductor devices 400 and 500 each with high reliability can be provided.

While embodiments of the invention have been particularly shown and described, it will be understood by those skilled in the art that the foregoing and other changes in form and details can be made therein without departing from the spirit and scope of the invention.

What is claimed is:

1. A polysilicon fuse comprising:

a first polysilicon fuse section for forming a cavity, the first polysilicon fuse section having a first narrowed portion with a narrow width and, on each side of the first narrowed portion, having a first electrode portion with a wide width which is connected to the first narrowed portion; and a second polysilicon fuse section for adjusting circuit characteristics, the second polysilicon fuse section having a second narrowed portion with a narrow width and, on each side of the second narrowed portion, having a second electrode portion with a wide width which is connected to the second narrowed portion, the first narrowed portion and the second narrowed portion being arranged overlaid with each other, with the first narrowed portion being arranged beneath the second narrowed portion, and with a dialectric layer disposed in between the first narrowed portion and the second narrowed portion.

2. The polysilicon fuse as claimed in claim 1 wherein the first polysilicon fuse section and the second polysilicon fuse section are arranged so that they are orthogonal to each other.

3. The polysilicon fuse as claimed in claim 1 wherein the insulating film has a thickness in the range of 0.1 μm to 0.5 μm.

4. A semiconductor device having the at least one polysilicon fuse as claimed in claim 1, the semiconductor device further comprising:

a first trimming pad connected to the at least one polysilicon fuse at the first electrode portion on one side of the first polysilicon fuse section;

a second trimming pad connected to the at least one polysilicon fuse at the second electrode portion on one side of the second polysilicon fuse section;

a first circuit characteristic adjusting element connected to the at least one polysilicon fuse with one end of the first circuit characteristic adjusting element at the second electrode portion on the one side of the second polysilicon fuse section; and a second circuit characteristic adjusting element connected to the ground with one end of the second circuit characteristic adjusting element, the first electrode portion on the other side of the first polysilicon fuse section and the second electrode portion on the other side of the second polysilicon fuse section being connected to the ground, and the first circuit characteristic adjusting element and the second circuit characteristic adjusting element being connected in parallel to each other with their respective other ends.

5. The semiconductor device as claimed in claim 4 wherein each of the first circuit characteristic adjusting element and the second circuit characteristic adjusting element is a resistor.

6. A semiconductor device having the at least one polysilicon fuse as claimed in claim 1, the semiconductor device further comprising:

a diode arranged with the anode thereof connected to the at least one polysilicon fuse at the first electrode portion on the one side of the first polysilicon fuse section and the cathode thereof connected to the at least one polysilicon fuse at the second electrode portion on the one side of the second polysilicon fuse section:

a trimming pad connected to the at least one polysilicon fuse at the first electrode portion on one side of the first polysilicon fuse section to which portion the anode of the diode is connected;

a first circuit characteristic adjusting element connected to the at least one polysilicon fuse with one end of the first circuit characteristic adjusting element at the second electrode portion on the one side of the second polysilicon fuse section to which portion the cathode of the diode is connected; and a second circuit characteristic adjusting element connected to the ground with one end of the second circuit characteristic adjusting element, the first electrode portion on the other side of the first polysilicon fuse section and the second electrode portion on the other side of the second polysilicon fuse section being connected to the ground, and the first circuit characteristic adjusting element and the second circuit characteristic adjusting element being connected in parallel to each other with their respective other ends.

7. The semiconductor device as claimed in claim 6 wherein each of the first circuit characteristic adjusting element and the second circuit characteristic adjusting element is a resistor.

8. A method of severing the polysilicon fuse as claimed in claim 1, the method comprising the steps of:

forming a cavity by applying a voltage across both of the first electrode portions of the first polysilicon fuse section to fuse the first narrowed portion; and after the step of forming the cavity, electrically severing the second polysilicon fuse section by applying a voltage across both of the second electrode portions of the second polysilicon fuse section to fuse the second narrowed portion and make the fused polysilicon break the dielectric layer disposed below the second narrowed portion and above the cavity to scatter into the cavity.

9. The method of severing the polysilicon fuse as claimed in claim 8 further comprising the step of positioning the first narrowed portion under the second narrowed portion before the step of forming the cavity.

* * * * *